(12) United States Patent
Hikmet et al.

(10) Patent No.: US 9,952,377 B2
(45) Date of Patent: *Apr. 24, 2018

(54) LIGHT EMITTING DEVICE WITH SPECTRAL CONVERSION ELEMENT

(71) Applicant: PHILIPS LIGHTING HOLDING B.V., Eindhoven (NL)

(72) Inventors: Rifat Ata Mustafa Hikmet, Eindhoven (NL); Ties Van Bommel, Eindhoven (NL); Dirk Kornelis Gerhardus De Boer, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 121 days.

This patent is subject to a terminal disclaimer.

(21) Appl. No.: 15/036,223

(22) PCT Filed: Nov. 5, 2014

(86) PCT No.: PCT/EP2014/073750
§ 371 (c)(1),
(2) Date: May 12, 2016

(87) PCT Pub. No.: WO2015/074867
PCT Pub. Date: May 28, 2015

(65) Prior Publication Data
US 2016/0291232 A1    Oct. 6, 2016

(30) Foreign Application Priority Data
Nov. 19, 2013 (EP) .................................... 13193552

(51) Int. Cl.
*F21V 8/00*     (2006.01)
*H01L 25/075*   (2006.01)
(Continued)

(52) U.S. Cl.
CPC ................ *G02B 6/005* (2013.01); *F21K 9/52* (2013.01); *F21K 9/56* (2013.01); *F21K 9/61* (2016.08);
(Continued)

(58) Field of Classification Search
CPC .... G02B 6/005; G02B 6/0055; G02B 6/0085; G02B 6/0096; F21V 29/502; F21K 9/61; F21K 9/64; F21K 9/52; F21K 9/56
See application file for complete search history.

(56) References Cited

U.S. PATENT DOCUMENTS 8,899,813 B2 * 12/2014 McCollum .............. G09F 13/02
                                                              362/612
9,462,650 B2 * 10/2016 Van Bommel ............ F21K 9/61
2013/0099264 A1    4/2013 Zimmerman et al.

FOREIGN PATENT DOCUMENTS

DE          10032837 A1    1/2002
DE       102008012316 A1   4/2009
(Continued)

*Primary Examiner* — Mary Ellen Bowman

(57) ABSTRACT

A light emitting device comprising at least one first light source (21, 22, 23, 24, 25, 211) adapted for, in operation, emitting first light (13) with a first spectral distribution, a first light guide (3) comprising a first light input surface (31), a first light exit surface (32) and at least one first further surface (33, 34, 35, 36), the first light guide being adapted for receiving the first light with the first spectral distribution at the first light input surface, guiding the first light to the first light exit surface and coupling the first light with the first spectral distribution out of the first light exit surface, at least one luminescent element (90) arranged on the first light exit surface of the first light guide, the at least one luminescent element comprising a second light input surface (91), a second light exit surface (92) and at least one light exit surface (92) and at least one second further surface (93, 94, 95, 96), the luminescent element spectral distribution at (Continued)

the second light input surface, converting at least a part of the first light with the first spectral distribution to second light (14) with a second spectral distribution, guiding the second light to the second light exit surface and coupling the second light with the second spectral distribution out of the second light exit surface, the light emitting device further comprising at least one first heat sink element (70) arranged at or on a surface of the luminescent element facing away from the second light input surface (92).

13 Claims, 8 Drawing Sheets

(51) Int. Cl.
| | | |
|---|---|---|
| H01L 33/50 | (2010.01) | |
| H01L 33/64 | (2010.01) | |
| F21V 29/502 | (2015.01) | |
| F21K 9/61 | (2016.01) | |
| F21K 9/64 | (2016.01) | |
| F21K 99/00 | (2016.01) | |
| H01L 33/58 | (2010.01) | |
| G03B 21/20 | (2006.01) | |

(52) U.S. Cl.
CPC .............. *F21K 9/64* (2016.08); *F21V 29/502* (2015.01); *G02B 6/0055* (2013.01); *G02B 6/0085* (2013.01); *G02B 6/0096* (2013.01); *H01L 25/0753* (2013.01); *H01L 33/507* (2013.01); *H01L 33/58* (2013.01); *H01L 33/642* (2013.01); *H01L 33/644* (2013.01); *G03B 21/204* (2013.01); *H01L 2924/0002* (2013.01)

(56) References Cited

FOREIGN PATENT DOCUMENTS

| EP | 2202444 A1 | 6/2010 |
|---|---|---|
| WO | WO2012006128A2 A2 | 1/2012 |
| WO | WO2012056382 A1 | 5/2012 |

\* cited by examiner

LIGHT EMITTING DEVICE WITH SPECTRAL CONVERSION ELEMENT

CROSS-REFERENCE TO PRIOR APPLICATIONS

This application is the U.S. National Phase application under 35 U.S.C. § 371 of International Application No. PCT/EP2014/073750, filed on Nov. 5, 2014, which claims the benefit European Patent Application No. 13193552.0, filed on Nov. 19, 2013. These applications are hereby incorporated by reference herein.

FIELD OF THE INVENTION

The invention relates to a light emitting device having at least one light source and a light guide. The invention further relates to a lamp, a luminaire or a lighting system comprising such a light emitting device.

BACKGROUND OF THE INVENTION

High intensity light sources, and particularly white high intensity light sources, are interesting for various applications including spots, stage-lighting, automotive lighting and digital light projection. For such purposes, as well as for obtaining a desired light shape, light distribution and color distribution with a point of high intensity, it is possible to make use of so-called light concentrators where short wavelength light is converted to longer wavelengths in a highly transparent luminescent material. Such a transparent luminescent material is illuminated by LEDs to produce longer wavelengths within the luminescent material. Converted light, which will be waveguided in the luminescent material, is extracted from a surface leading to a point of high brightness.

Document WO 2012/056382 A1 describes in one embodiment a lighting device comprising a waveguide and a light source. The waveguide may be provided with a luminescent material arranged on or in the waveguide and may thereby be configured to convert light from a light source into luminescent material emission.

A problem associated with this configuration is related to bringing enough light to the light guide while keeping the temperature relatively low. In the prior art configurations LEDs, and in some configurations densely packed LEDS, e.g. 30, 40 or even 50 LEDs, are placed at a close distance from the light guide in order to couple in as much light as possible. As a result of the LEDs being too close to the light guide heat from the LEDs leads to heating of the light guide and decreases the optical performance of both the light guide and LEDs.

DE102008012316A1 discloses a semiconductor light source and a luminescent converter element both arranged on a common heat sink. Light emitted by the semiconductor light source is guided via a light guide to the luminescent convertor element.

EP2202444A1 discloses a LED module that emits light towards a phosphor module. The phosphor module includes a transparent layer, closest to the LED module, and a phosphor layer directly adjacent to the transparent layer. The phosphor module may further include a heat sink.

WO2012/006128A2 discloses a high lumen output and brightness illumination module using an excitation light source and wavelength conversion part with multi-channel heat dissipation.

SUMMARY OF THE INVENTION

It is an object of the present invention to overcome this problem, and to provide a light emitting device with which a large amount of light is brought to and coupled into the light guide while keeping the temperature of the light guide relatively low as well as to optimize the optical performance of both the light guide and the LEDs of the light emitting device.

According to a first aspect of the invention, this and other objects are achieved by means of a light emitting device comprising a plurality of first solid state light sources adapted for, in operation, emitting first light with a first spectral distribution, a first light guide comprising a first light input surface, a first light exit surface and at least one first further surface, the first light guide being adapted for receiving the first light with the first spectral distribution at the first light input surface, guiding the first light to the first light exit surface and coupling the first light with the first spectral distribution out of the first light exit surface, the plurality of light sources being arranged adjacent to and in optical contact with the first light input surface of the first light guide, at least one luminescent element arranged on the first light exit surface of the first light guide, the at least one luminescent element comprising a second light input surface, a second light exit surface and at least one second further surface, the second light input surface and the second light exit surface extending at an angle different from zero with respect to another, the luminescent element being adapted for receiving the first light with the first spectral distribution at the second light input surface, converting at least a part of the first light with the first spectral distribution to second light with a second spectral distribution, guiding the second light to the second light exit surface and coupling the second light with the second spectral distribution out of the second light exit surface, the light emitting device further comprising at least one first heat sink element arranged at or on a surface of the luminescent element opposite and parallel to the second light input surface.

By providing a luminescent element being adapted for converting at least a part of the incoupled light to converted light with a different spectral distribution, and guiding the light to an exit surface, a light emitting device is provided with which a particularly large amount of the converted light will stay in the luminescent element and which can be extracted from one of the surfaces, which in turn leads to a particularly high intensity gain.

By providing at least one first heat sink element arranged at or on a surface of the luminescent element facing away from or, in other words, which is opposite to the second light input surface, and by furthermore providing a first light guide arranged between the light sources and the luminescent element, light from the light sources can be brought to the luminescent element while most of the heat generated by the light sources is not transferred to the luminescent element and efficient cooling of the luminescent element is ensured. Thereby a light emitting device is provided with which a large amount of light is brought to and coupled into the light guide while keeping the temperature of the luminescent element relatively low.

Also, with a light emitting device according to the invention fewer and thus less densely packed LEDs may be applied for obtaining a high output light intensity as compared with the prior art, which also contributes to keeping the temperature of the luminescent element relatively low.

Furthermore, both of the above features contribute to the provision of a light emitting device with an optimized optical performance of both the light guide and the light sources.

In an embodiment the area of the first light exit surface of the first light guide is 2 times smaller than the area of the first light input surface. In this way more solid state light sources can be arranged at the first light input surface and an improved concentration of light providing for an increased brightness can be achieved. In other embodiments the area of the first light exit surface of the light guide is 5, or even 10 times smaller than the area of the first light input surface.

In an embodiment the first light guide comprises has a first refractive index, the at least one luminescent element comprises has a second refractive index and the second refractive index of the at least one luminescent element is larger than the first refractive index of the first light guide.

Thereby most of the light guided by the first light guide will be coupled into the luminescent element thus reducing the loss of light involved in the coupling of light into the luminescent element. This in turn contributes to increasing the intensity and thus brightness of the light emitted by the light emitting device.

In an embodiment the light emitting device further comprises a coupling element adapted for coupling light out of the first light guide and into the at least one luminescent element and arranged between the first light guide and the at least one luminescent element.

In this configuration the coupling element takes care of optical coupling of light from the wave guide into the luminescent element. Thereby most of the light guided by the first light guide will be coupled into the luminescent element while converted light will, to a large extent, not leak into the wave guide thereby reducing the loss of light involved in the coupling of light into the luminescent element. This in turn contributes to increasing the intensity and thus brightness of the light emitted by the light emitting device.

In an embodiment the first light guide comprises a first refractive index, the at least one luminescent element comprises a second refractive index, the coupling element comprises a third refractive index and the third refractive index of the coupling element is smaller than at least one of the second refractive index of the at least one luminescent element and the first refractive index of the first light guide. This ensures that only a relatively small fraction of converted light or no converted light leaks from the luminescent element back into wave guide.

These embodiments ensure that a particularly large fraction of the light guided by the first light guide will be coupled into the luminescent element thereby further reducing the loss of light involved in the coupling of light into the luminescent element. This in turn contributes to increasing the intensity and thus brightness of the light emitted by the light emitting device.

In an embodiment the first light guide is made of a material having a thermal conductivity which is smaller than 1 W/(K*m).

Thereby a light emitting device is provided with which a particularly small fraction of the heat generated by the light sources is transferred to the luminescent element without compromising the amount of light guided thereto, thus ensuring an even more efficient cooling of the luminescent element.

In an embodiment the first light input surface and the first light exit surface extend in an angle different from zero to one another. In a particular embodiment the first light input surface and the first light exit surface extend perpendicular to one another.

By providing a light emitting device with a light guide having a light input surface and a light exit surface extending in an angle different from zero to each other, and particularly extending perpendicular to each other, a light emitting device is obtained with which an optimally large amount of light is guided towards the respective light exit surfaces by means of total internal reflection (TIR). This in turn lowers the amount of light lost through other surfaces of the first light guide than the light exit surface and thus further increases the intensity and thus the brightness of the light emitted by the light emitting device.

In an embodiment the first light guide is adapted for converting incident light to converted light with a spectral distribution being different from that of the incident light.

Thereby a light emitting device is provided with which at least a part of the light coupled into the first light guide through the at least one first further surface and guided through the first light guide may be subjected to a second wavelength conversion prior to the wavelength conversion occurring in the luminescent element, and with which the light output of the light emitting device may thus be provided with a more complex spectral distribution.

In an embodiment of the light emitting device further the plurality of light sources are also arranged adjacent to and in optical contact with at least one first further surface of the first light guide.

Thereby more light may be coupled into the light guide and thus into the luminescent element, which provides for a light emitting device emitting light with an even larger intensity and thus larger brightness.

In an embodiment the at least one heat sink element is made of a material having a thermal conductivity which is larger than 1 W/(K*m), larger than 10 W/(K*m) or larger than 20 W/(K*m).

Thereby a particularly good dissipation of heat away from the light guide is obtained. It is noted that generally, the larger the thermal conductivity, the better the heat dissipation.

In an embodiment the light emitting device further comprises at least one further heat sink element arranged at one of the at least one first further surface of the first light guide.

Thereby a light emitting device is provided having further improved heat dissipation properties as the area and/or volume available for dissipating heat is increased.

In an embodiment the first light guide extends adjacent to at least two surfaces of the at least one luminescent element.

Such an embodiment improves the coupling of light from the first light guide to the luminescent element even further as the area through which light may be coupled into the luminescent element is increased.

In an embodiment the light emitting device further comprises at least one coupling element adapted for coupling light out of the first light guide, the coupling element being arranged on a surface of the first light guide facing away from the at least one luminescent element.

Thereby a light emitting device is provided with which light may be emitted in more than one direction simultaneously.

In an embodiment the light emitting device further comprises at least one second light source adapted for, in operation, emitting third light with a third spectral distribution, and a second light guide comprising a third light input surface and a third light exit surface, the second light guide being adapted for receiving the third light with the third spectral distribution at the third light input surface, guiding the third light to the third light exit surface and coupling the third light with the third spectral distribution out of the third light exit surface, the luminescent element further being adapted for receiving the third light with the third spectral distribution coupled out of the third light exit surface of the second light guide, guiding the third light to the second light exit surface and coupling the third light with the third spectral distribution out of the second light exit surface.

In an embodiment the second light guide is furthermore adapted for converting at least a part of the third light with the third spectral distribution to fourth light with a fourth spectral distribution, guiding the fourth light to the third light exit surface and coupling the fourth light with the fourth spectral distribution out of the third light exit surface.

In addition to advantages similar to those mentioned above, these embodiments provide for a light emitting device emitting light with an even larger intensity or brightness and being capable of providing light beams with a desired light distribution and color distribution of a higher complexity in a simple and cost effective manner, particularly as the total light output of a light emitting device according to these embodiments comprises at least one further light output component, namely the third light and optionally also the fourth light.

Furthermore, these embodiments provide for further parameters usable for obtaining different geometrical configurations of the light emitting device.

The invention furthermore relates to a lamp, a luminaire, or a lighting system comprising a light emitting device according to any one of the previous claims, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

Figure 1:
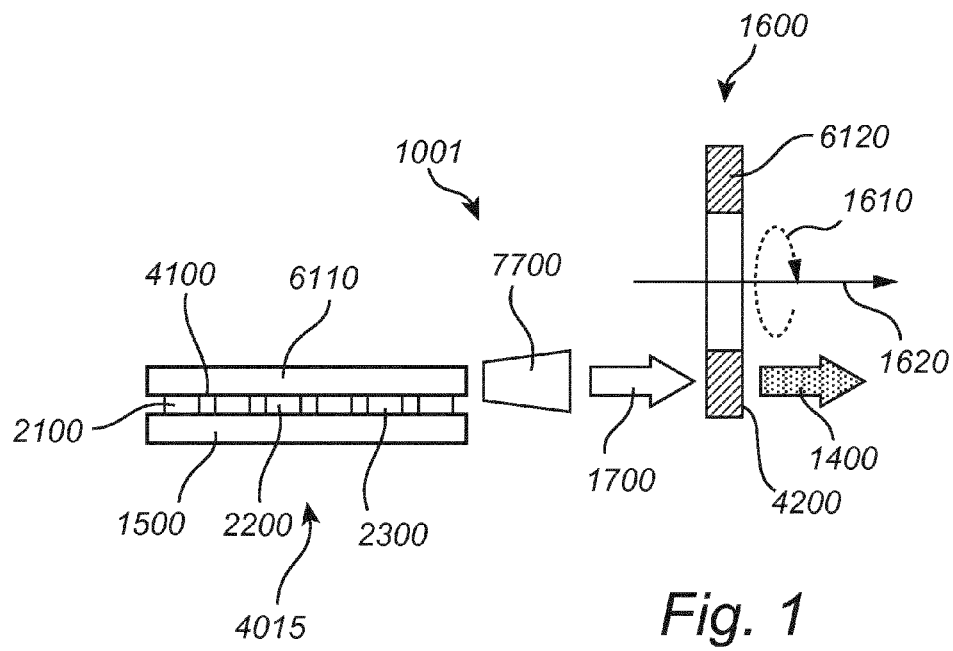
FIG. 1 shows a cross sectional view of a light emitting device comprising a phosphor wheel.

As illustrated in the figures, the sizes of layers, elements and regions are exaggerated for illustrative purposes and, thus, are provided to illustrate the general structures of embodiments of the present invention. Like reference numerals refer to like elements throughout, such that e.g. a light emitting device according to the invention is generally denoted 1, whereas different specific embodiments thereof are denoted by adding 01, 02, 03 and so forth to the general reference numeral. With regard to FIGS. 1 to 3B showing a number of features and elements which may be added to any one of the embodiments of a light emitting device according to the invention as set forth further below, generally "00" has been added to all elements except those specific to one of these Figures.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The following description will start with general considerations regarding applications, suitable light sources and suitable materials for various elements and features of a light emitting device according to the invention. For this purpose a number of features and elements which may be added to any one of the embodiments of a light emitting device according to the invention as set forth further below will be described with reference to FIGS. 1 to 3B. The specific embodiments of a light emitting device according to the invention will be described in detail with reference to FIGS. 4 to 14.

A light emitting device according to the invention may be used in applications including but not being limited to a lamp, a light module, a luminaire, a spot light, a flash light, a projector, a digital projection device, automotive lighting such as e.g. a headlight or a taillight of a motor vehicle, arena lighting, theater lighting and architectural lighting.

Light sources which are part of the embodiments according to the invention as set forth below, are adapted for, in operation, emitting light with a first spectral distribution. This light is subsequently coupled into a light guide or waveguide. The light guide or waveguide may convert the light of the first spectral distribution to another spectral distribution and guides the light to an exit surface. The light source may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the blue color-range which is defined as a wavelength range of between 380 nm and 495 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

The light source may be a red light source, i.e. emitting in a wavelength range of e.g. between 600 nm and 800 nm. Such a red light source may be e.g. a light source of any of the above mentioned types directly emitting red light or provided with a phosphor suitable for converting the light source light to red light. This embodiment is particularly advantageous in combination with a light guide adapted for converting the light source light to infrared (IR) light, i.e. light with a wavelength of more than about 800 nm and in a suitable embodiment with a peak intensity in the range from 810 to 850 nm. In an embodiment such a light guide comprises an IR emitting phosphor. A light emitting device with these characteristics is especially advantageous for use in night vision systems, but may also be used in any of the applications mentioned above.

Another example is combination of a first, red light source emitting light in a wavelength range between 480 nm and 800 nm and coupling this light into a luminescent rod or waveguide, and a second light source, emitting blue or UV or violet light, i.e. with a wavelength smaller than 480 nm, and also coupling its emitted light into the luminescent waveguide or rod. The light of the second light source is converted by the luminescent waveguide or rod to a wavelength range between 480 nm and 800 nm, and the light of the first light source coupled into the luminescent waveguide or rod will not be converted. In other words, the second light source emits UV, violet or blue light and is subsequently converted by the luminescent concentrator into light in the green-yellow-orange-red spectral region. In another embodiment the first light source emits in a wavelength range between 500 nm and 600 nm, and the light of the second light source is converted by the luminescent waveguide or rod to a wavelength range between 500 nm and 600 nm. In another embodiment the first light source emits in a wavelength range between 600 nm and 750 nm, and the light of the second light source is converted by the luminescent waveguide or rod to a wavelength range between 600 nm and 750 nm. In an embodiment the light of the first light source is coupled into the luminescent waveguide or rod at another surface, for example a surface opposite to an exit surface of the light, than a surface where the light of the second light source is coupled into the luminescent waveguide or rod. These embodiments provide a luminescent waveguide or rod emitting in the red light range with an increased brightness.

The light guides as set forth below in embodiments according to the invention generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments <10 mm, in other embodiments <5 mm, in yet other embodiments <2 mm. The width W is in embodiments <10 mm, in other embodiments <5 mm, in yet embodiments <2 mm. The length L is in embodiments larger than the width W and the height H, in other embodiments at least 2 times the width W or 2 times the height H, in yet other embodiments at least 3 times the width W or 3 times the height H. The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Transparent light guides may in embodiments comprise a transparent substrate on which a plurality of light sources, for example LEDs, are grown epitaxially. The substrate is in embodiments a single crystal substrate, such as for example a sapphire substrate. The transparent growth substrate of the light sources is in these embodiments the light concentrating light guide.

The generally rod shaped or bar shaped light guide can have any cross sectional shape, but in embodiments has a cross section the shape of a square, rectangle, round, oval, triangle, pentagon, or hexagon. Generally the light guides are cuboid, but may be provided with a different shape than a cuboid, with the light input surface having somewhat the shape of a trapezoid. By doing so, the light flux may be even enhanced, which may be advantageous for some applications.

Suitable materials for the light guides as set forth below according to embodiments of the invention are sapphire, polycrystalline alumina and/or undoped transparent garnets such as YAG, LuAG having a refractive index of n=1.7. An additional advantage of this material (above e.g. glass) is that it has a good thermal conductivity, thus diminishing local heating. Other suitable materials include, but are not limited to, glass, quartz and transparent polymers. In other embodiments the light guide material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The light guides as set forth below according to embodiments of the invention may comprise a suitable luminescent material for converting the light to another spectral distribution. Suitable luminescent materials include inorganic phosphors, such as doped YAG, LuAG, organic phosphors, organic fluorescent dyes and quantum dots which are highly suitable for the purposes of embodiments of the present invention as set forth below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in embodiments of the present invention as set forth below. However, it may be preferred for reasons of environmental safety and concern to use cadmium-free quantum dots or at least quantum dots having very low cadmium content.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

The luminescent material may also be an inorganic phosphor. Examples of inorganic phosphor materials include, but are not limited to, cerium (Ce) doped YAG ($Y_3Al_5O_{12}$) or LuAG ($Lu_3Al_{15}O_{12}$). Ce doped YAG emits yellowish light, whereas Ce doped LuAG emits yellow-greenish light. Examples of other inorganic phosphors materials which emit red light may include, but are not limited to ECAS and BSSN; ECAS being $Ca_{1-x}AlSiN_3$:Eux wherein $0<x\leq1$, in other embodiments $0<x\leq0.2$; and BSSN being $Ba_{2-x-z}M_xSi_{5-y}AlyN_{8-y}O_y$:$Eu_z$ wherein M represents Sr or Ca, $0\leq x\leq1$, $0<y\leq4$, and $0.0005\leq z\leq0.05$, and in embodiments $0\leq x\leq0.2$.

In embodiments of the invention as set forth below, the luminescent material is made of material selected from the group comprising $(M{<}I{>}_{(1-x-y)}M{<}II{>}_x\ M{<}III{>}_y)_3$ $(M{<}IV{>}_{(1-z)}M{<}V{>}_z)_5O_{12}$ where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu or mixtures thereof, M<IV> is Al, M<V> is selected from the group comprising Ga, Sc or mixtures thereof, and $0<x\leq1$, $0<y\leq0.1$, $0<z<1$, $(M{<}I{>}_{(1-x-y)}M{<}II{>}_xM{<}III{>}_y)_2O_3$ where M<I> is selected from the group comprising Y, Lu or mixtures thereof, M<II > is selected from the group comprising Gd, La, Yb or mixtures thereof, M<III > is selected from the group comprising Tb, Pr, Ce, Er, Nd, Eu, Bi, Sb or mixtures thereof, and $0<x\leq1$, $0<y\leq0.1$, $(M{<}I{>}_{(1-x-y)}M{<}II{>}_xM{<}III{>}_y)$ $S_{(1-z)}Se$ where M<I> is selected from the group comprising Ca, Sr, Mg, Ba or mixtures thereof, M<II> is selected from the group comprising Ce, Eu, Mn, Tb, Sm, Pr, Sb, Sn or mixtures thereof, M<III> is selected from the group comprising K, Na, Li, Rb, Zn or mixtures thereof, and $0<x\leq0.01$, $0<y\leq0.05$, $0\leq z<1$, $(M{<}I{>}_{(1-x-y)}M{<}II{>}_xM{<}III{>}_y)O$ where M<I> is selected from the group comprising Ca, Sr, Mg, Ba or mixtures thereof, M<II> is selected from the group comprising Ce, Eu, Mn, Tb, Sm, Pr or mixtures thereof, M<III> is selected from the group comprising K, Na, Li, Rb, Zn or mixtures thereof, and $0<x\leq0.1$, $0<y\leq0.1$, $(M{<}I{>}_{(2-x)}M{<}II{>}_xM{<}III{>}_2)O_7$ where M<I> is selected from the group comprising La, Y, Gd, Lu, Ba, Sr or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and $0<x\leq1$, $(M{<}I{>}_{(1-x)}M{<}II{>}_xM{<}III{>}_{(1-y)}M{<}IV{>}_y)O_3$ where M<I> is selected from the group comprising Ba, Sr, Ca, La, Y, Gd, Lu or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and M<IV> is selected from the group comprising Al, Ga, Sc, Si or mixtures thereof, and $0<x\leq0.1$, $0<y\leq0.1$, or mixtures thereof.

Other suitable luminescent materials are Ce doped Yttrium aluminum garnet (YAG, $Y_3Al_5O_{12}$) and Lutetium-Aluminum-Garnet (LuAG). A luminescent light guide may comprise a central emission wavelength within a blue color-range or within a green color-range or within a red color-range. The blue color-range is defined between 380 nanometer and 495 nanometer, the green color-range is defined between 495 nanometer and 590 nanometer, and the red color-range is defined between 590 nanometer and 800 nanometer.

A selection of phosphors which may be used in embodiments is given in table 1 below along with the maximum emission wavelength.

TABLE 1

| Phosphor | Maximum emission wavelength [nm] |
|---|---|
| $CaGa_2S_4$:Ce | 475 |
| $SrGa_2S_4$:Ce | 450 |
| $BaAl_2S_4$:Eu | 470 |
| $CaF_2$:Eu | 435 |
| $Bi_4Si_3O_{12}$:Ce | 470 |
| $Ca_3Sc_2Si_3O_{12}$:Ce | 490 |

In embodiments of the light emitting device according to the invention as set forth below a coupling structure or a coupling medium may be provided for efficiently coupling the light emitted by the light source into the light guide. The coupling structure may be a refractive structure having features, such as e.g. protrusions and recesses forming a wave shaped structure. The typical size of the features of the coupling structure is 5 μm to 500 μm. The shape of the features may be e.g. hemispherical (lenses), prismatic, sinusoidal or random (e.g. sand-blasted). By choosing the appropriate shape, the amount of light coupled into the light guide can be tuned. The refractive structures may be made by mechanical means such as by chiseling, sand blasting or the like. Alternatively, the refractive structures may be made by replication in an appropriate material, such as e.g. polymer or sol-gel material. Alternatively, the coupling structure may be a diffractive structure, where the typical size of the features of the diffractive coupling structure is 0.2 μm to 2 μm. The diffraction angles $\theta_{in}$ inside the light guide are given by the grating equation $\lambda/\Lambda = n_{in} \cdot \sin\theta_{in} - n_{out} \cdot \sin\theta_{out}$, where λ is the wavelength of LED light, Λ is the grating period, $n_{in}$ and $n_{out}$ are the refractive indices inside and outside the light guide, $\theta_{in}$ and $\theta_{out}$ are the diffraction angle inside and the incident angle outside the light guide, respectively. If we assume the same refractive index $n_{out}=1$ for low-index layer and coupling medium, we find, with the condition for total internal reflection $n_{in} \sin\theta_{in}=n_{out}$, the following condition: $\lambda/\Lambda=1-\sin\theta_{out}$, i.e. $\Lambda=\lambda$ for normal incidence $\theta_{out}=0$. Generally, not all other angles $\theta_{out}$ are diffracted into the light guide. This will happen only if its refractive index $n_{in}$ is high enough. From the grating equation it follows that for the condition $n_{in} \geq 2$ all angles are diffracted if $\Lambda=\lambda$. Also other periods and refractive indices may be used, leading to less light that is diffracted into the light guide. Furthermore, in general a lot of light is transmitted ($0^{th}$ order). The amount of diffracted light depends on the shape and height of the grating structures. By choosing the appropriate parameters, the amount of light coupled into the light guide can be tuned. Such diffractive structures most easily are made by replication from structures that have been made by e.g. e-beam lithography or holography. The replication may be done by a method like soft nano-imprint lithography. The coupling medium may e.g. be air or another suitable material.

FIG. 1 shows a light emitting device 1001 comprising a light guide 4015 according to embodiments of the invention as set forth below. The light emitting device 1001 shown in FIG. 1 comprises a rotatable phosphor wheel 1600, and it further comprises a coupling element 7700 arranged between the light guide 4015 and the phosphor wheel 1600.

The light emitting device 1001 further comprises a light source in the form of a plurality of LEDs 2100, 2200, 2300 arranged on a base or substrate 1500. The plurality of LEDs 2100, 2200, 2300 are used to pump a conversion part 6110 of the light guide 4015 to produce light 1700 having a third spectral distribution, such as green or blue light. The phosphor wheel 1600, which is rotating in a rotation direction 1610 about an axis of rotation 1620, is used for converting the light 1700 having the third spectral distribution to light 1400 having a second spectral distribution, such as red and/or green light. It is noted that in principle any combination of colors of the light 1700 and the light 1400 is feasible.

As shown in FIG. 1, illustrating the phosphor wheel 1600 in a cross sectional side view, the phosphor wheel 1600 is used in the transparent mode, i.e. incident light 1700 enters the phosphor wheel 1600 at one side, is transmitted through the phosphor wheel 1600 and emitted from an opposite side thereof forming the light exit surface 4200. Alternatively, the phosphor wheel 1600 may be used in the reflective mode (not shown) such that light is emitted from the same surface as the surface through which it enters the phosphor wheel.

The phosphor wheel 1600 may comprise only one phosphor throughout. Alternatively, the phosphor wheel 1600 may also comprise segments without any phosphor such that also part of the light 1700 may be transmitted without being converted. In this way sequentially other colors can be generated. In another alternative, the phosphor wheel 1600 may also comprise multiple phosphor segments, e.g. segments of phosphors emitting yellow, green and red light, respectively, such as to create a multi-colored light output. In yet another alternative, the light emitting device 1001 may be adapted for generating white light by employing a pixelated phosphor-reflector pattern on the phosphor wheel 1600.

In an embodiment the coupling element 7700 is an optical element suitable for collimating the light 1700 incident on the phosphor wheel 1600, but it may also be a coupling medium or a coupling structure such as e.g. the coupling medium or the coupling structure 7700 described above. The light emitting device 1001 may furthermore comprise additional lenses and/or collimators. For example, additional optics may be positioned such as to collimate the light emitted by the light sources 2100, 2200, 2300 and/or the light 1400 emitted by the light emitting device 1001.

Figure 2:
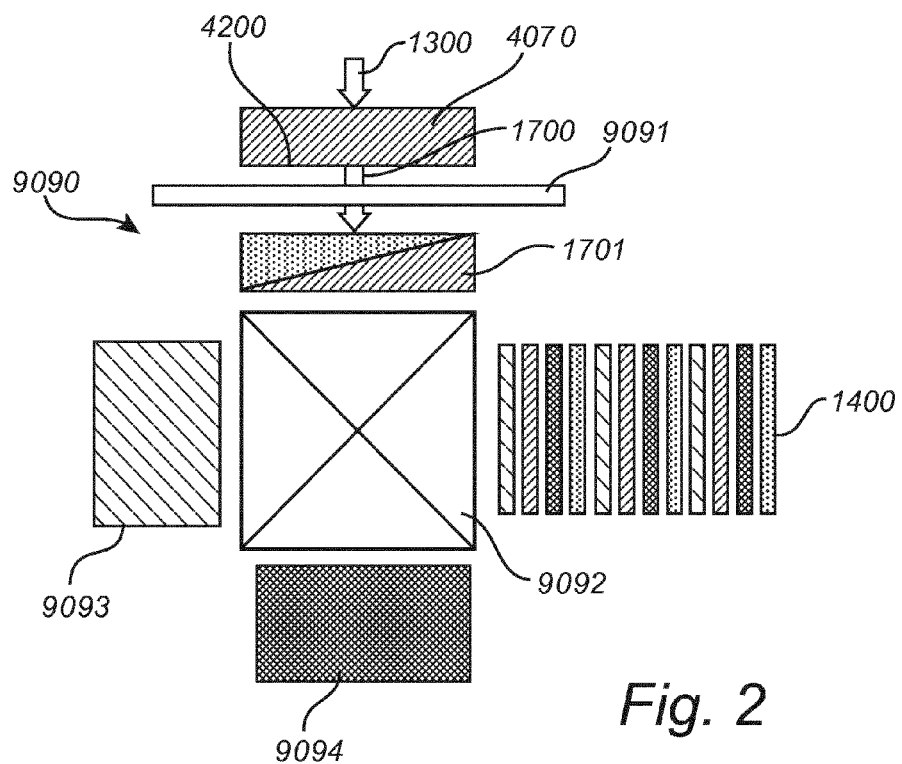
FIG. 2 shows a side view of a lighting system with a light guide and additional light sources and which is provided with a filter and a dichroic optical element.

FIG. 2 shows a side view of a lighting system, e.g. a digital projector, with a light emitting device 4070 which is adapted for converting incident light 1300 in such a way that the emitted light 1700 is in the yellow and/or orange wavelength range, i.e. roughly in the wavelength range of 560 nm to 600 nm. The light emitting device 4070 may e.g. be provided as a transparent garnet made of ceramic materials such as Ce-doped $(Lu,Gd)_3Al_5O_{12}$, $(Y,Gd)_3Al_5O_{12}$ or $(Y,Tb)_3Al_5O_{12}$. With higher Ce-content and/or higher substitution levels of e.g. Gd and/or Tb in favor of Ce, the spectral distribution of the light emitted by the light guide can be shifted to higher wavelengths. In an embodiment, the light guide 4070 is fully transparent.

At the light exit surface 4200 an optical element 9090 is provided. The optical element 9090 comprises a filter 9091 for filtering the light 1700 emitted from the light emitting device 4070 such as to provide filtered light 1701, at least one further light source 9093, 9094 and an optical component 9092 adapted for combining the filtered light 1701 and the light from the at least one further light source 9093, 9094 such as to provide a common light output 1400. The filter 9091 may be an absorption filter or a reflective filter, which may be fixed or switchable. A switchable filter may e.g. be obtained by providing a reflective dichroic mirror, which may be low-pass, band-pass or high-pass according to the desired light output, and a switchable mirror and placing the switchable mirror upstream of the dichroic mirror seen in the light propagation direction. Furthermore, it is also feasible to combine two or more filters and/or mirrors to select a desired light output. The filter 9091 shown in FIG. 2 is a switchable filter enabling the transmission of unfiltered yellow and/or orange light or filtered light, particularly and in the embodiment shown filtered red light, according to the switching state of the filter 9091. The spectral distribution of the filtered light depends on the characteristics of the filter 9091 employed. The optical component 9092 as shown may be a cross dichroic prism also known as an X-cube or it may in an alternative be a suitable set of individual dichroic filters.

In the embodiment shown two further light sources 9093 and 9094 are provided, the further light source 9093 being a blue light source and the further light source 9094 being a green light source. Other colors and/or a higher number of further light sources may be feasible too. One or more of the further light sources may also be light guides according to embodiments of the invention as set forth below. A further option is to use the light filtered out by the filter 9091 as a further light source. The common light output 1400 is thus a combination of light 1701 emitted by the light emitting device 4070 and filtered by the filter 9091 and light emitted by the respective two further light sources 9093 and 9094. The common light output 1400 may advantageously be white light.

The solution shown in FIG. 2 is advantageous in that it is scalable, cost effective and easily adaptable according to the requirements for a given application of a light emitting device according to embodiments of the invention.

Figure 3A:
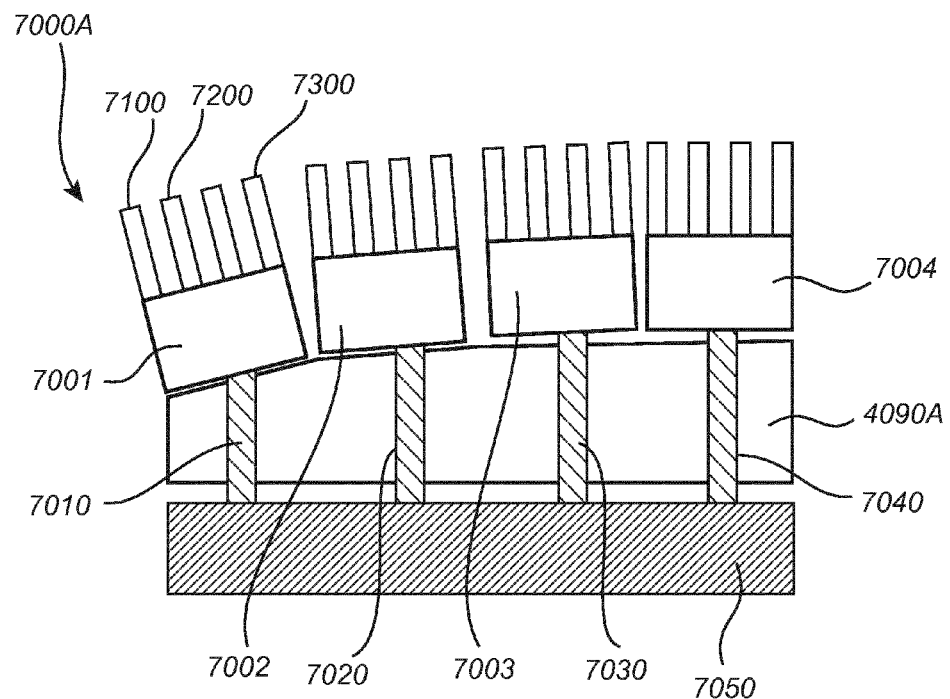
FIG. 3A and 3B show light guides provided with a heat sink element arranged
Figure 3B:
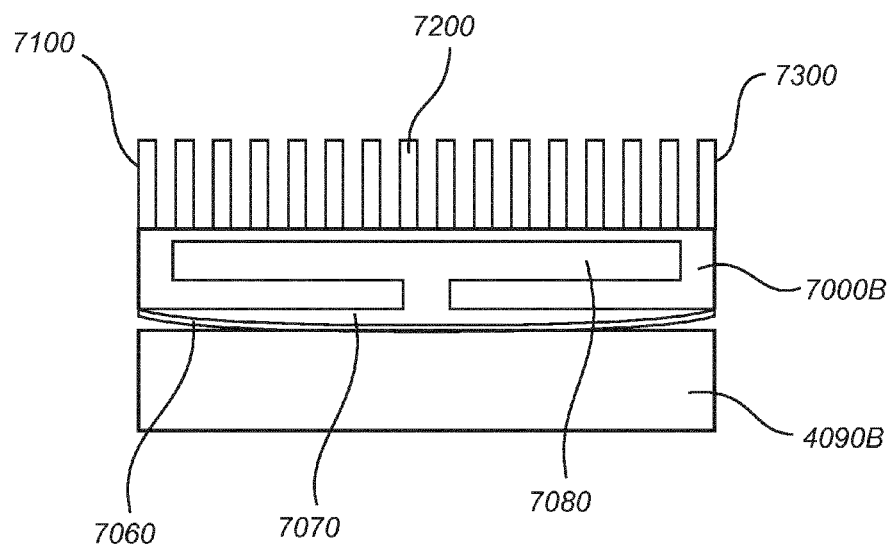

FIGS. 3A and 3B show a side view of a light guide or luminescent element 4090A and a light guide or luminescent element 4090B, respectively, that comprise a heat sink element 7000A, 7000B, respectively, arranged on one of the surfaces of the light guide or luminescent element 4090A, 4090B, respectively, different from the light input surface, in embodiments at a distance of about 30 μm or less therefrom. Irrespective of the embodiment the respective heat sink element 7000A, 7000B comprises fins 7100, 7200, 7300 for improved heat dissipation, the fins, however, being optional elements. Irrespective of the embodiment the respective heat sink element 7000A, 7000B is adapted to be conformable to the surface shape of the light guide, and is thus adapted for providing a conformal thermal contact over the whole contact area with the light guide. Thereby an increased thermal contact area and thus an improved cooling of the light guide is obtained and the existing tolerance limits on the positioning of the heat sink element become less critical.

FIG. 3A shows that heat sink element 7000A comprises a plurality of heat sink parts, here four heat sink parts 7001, 7002, 7003 and 7004, one or more of which, here all four, may be provided with fins. Obviously, the more heat sink parts the heat sink element 7000A comprises, the more precisely the heat sink element 7000 may be conformed to the surface of the light guide. Each heat sink part 7001, 7002, 7003, 7004 is adapted for providing a conformal thermal contact over the whole contact area with the light guide. The heat sink parts may be arranged in mutually different distances from the surface of the light guide. Furthermore, the heat sink element 7000A comprises a common carrier 7050 to which the heat sink parts 7001,

7002, 7003 and 7004 are attached individually by means of attachment elements 7010, 7020, 7030 and 7040, respectively. Alternatively each heat sink part may be assigned its own carrier. It is noted that these elements are optional.

FIG. 3B shows that heat sink element 7000B comprises a bottom part 7060 adapted to be conformable to the shape of the surface of the light guide or luminescent element 4090B at which it is to be arranged. The bottom part 7060 is flexible and may e.g. be a thermally conductive metal layer such as a copper layer. The heat sink element 7000B further comprises a thermally conductive layer 7070 arranged between the bottom element 7060 and the remainder of the heat sink element 7000B for improved flexibility and conformability of the heat sink element 7000B. The thermally conductive layer 7070 may e.g. be a thermally conductive fluid or paste. The thermally conductive layer 7070 is in an embodiment highly reflective and/or comprises a highly reflective coating. The heat sink element 7000B further comprises a fluid reservoir 7080 arranged inside the heat sink element 7000B for generating a fluid flow for improved heat dissipation. In an alternative, the fluid reservoir 7080 may also be arranged externally on the heat sink element 7000B, e.g. extending along a part of or the whole external periphery of the heat sink element 7000B. The fluid flow may be enhanced by means of a pump. It is noted that the conductive layer 7070 and the fluid reservoir 7080 are optional elements.

Irrespective of the embodiment, the heat sink element 7000A, 7000B may be made of a material selected from copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. Furthermore, a heat sink element combining features of the embodiments described above is feasible. Also, it is feasible to arrange a heat sink element according to any of the above embodiments at more than one surface of the light guide or luminescent element 4090A or 4090B.

Finally it is noted that the provision of a heat sink element as described above is especially advantageous in a light emitting device employing a light source emitting in the red wavelength range and/or being adapted for emitting light in the infrared wavelength range, e.g. by comprising an IR emitting phosphor.

Figure 4:
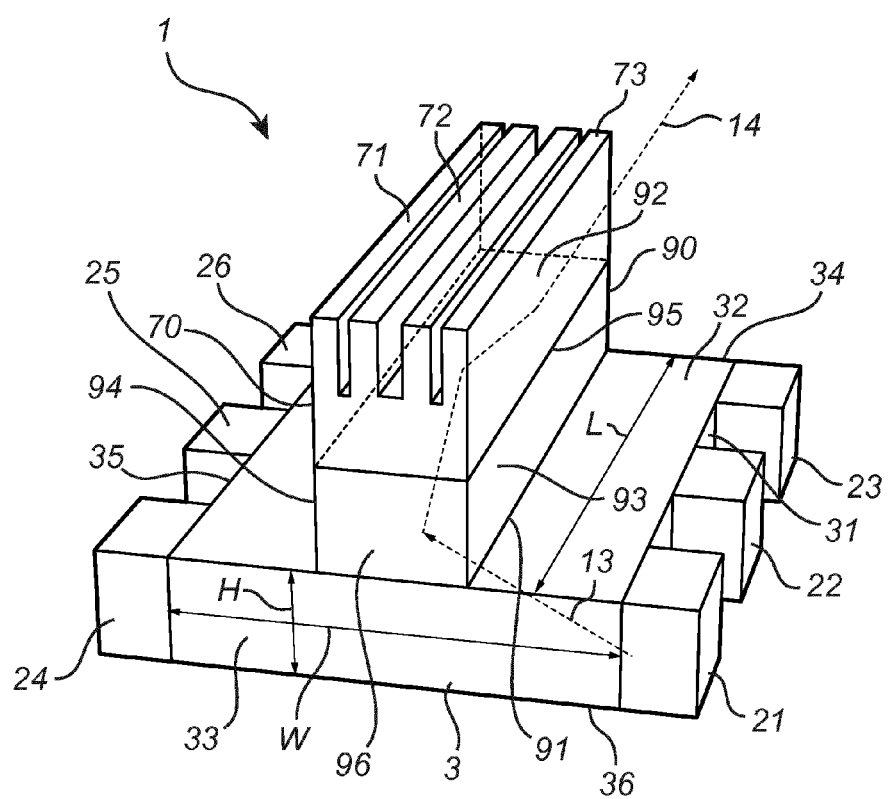
FIG. 4 shows a perspective view of a first embodiment of a light emitting device according to the invention.
Figure 5:
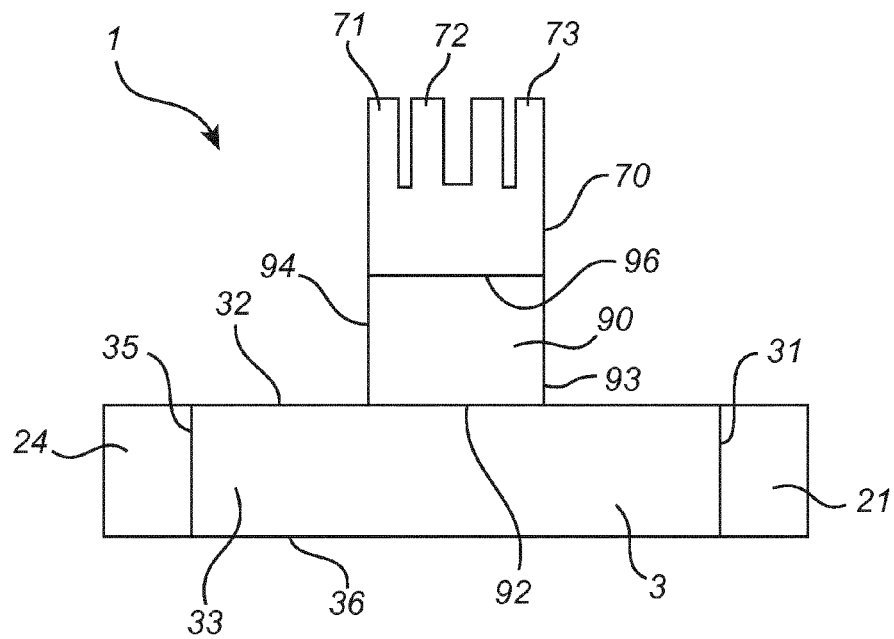
FIG. 5 shows an end view of the light emitting device according to FIG. 4.

FIG. 4 shows a perspective view of a light emitting device 1 according to a first and general embodiment of the invention. FIG. 5 shows an end view of the light emitting device 1. The light emitting device 1 generally comprises at least one first light source 21, 22, 23, 24, 25, 26, a first light guide 3, at least one luminescent element 90 and at least one heat sink element 70.

The light sources described herein are in embodiments solid state light sources such as LEDs, suitable types of LEDs being described above. In an embodiment the first light sources 21, 22, 23, 24, 25, 26 all emit light having the same spectral distribution, but may in alternative embodiments emit light having two or more different spectral distributions. In an embodiment the light sources emit light in the blue wavelength range, but the light sources may also emit light in the violet or ultraviolet wavelength range. For instance, embodiments are also feasible in which e.g. the first light sources 21, 22, 23 arranged at the first light input surface 31 emit light with a spectral distribution which is different from the spectral distribution emitted by the first light sources 24, 25, 26 arranged at the surface 35.

The first light sources 21, 22, 23, 24, 25, 26 may be arranged on a base or substrate in the form of a heat sink, in embodiments made of a metal such as copper, iron or aluminum. This heat sink may comprise fins for improved heat dissipation. It is noted that in other embodiments the base or substrate need not be a heat sink. By providing a heat sink the heat produced by the light source may in an efficient manner be dissipated away from the light guide. This in turn provides for an increase in the maximum obtainable output light intensity of the light emitting device as well as for lowering or even eliminating the adverse effects on the optical performance of the light emitting device caused by excess heat in the light guide. The base or substrate is, however, not an essential element, and may thus in yet other embodiments be omitted.

As may be seen the first light sources in the present embodiment are arranged in two rows each having three first light sources. It is noted that in principle any other number of first light sources may be present, such as e.g. five, ten or twenty first light sources.

The first light guide 3 is shown shaped generally as a plate having a first light input surface 31 and a first light exit surface 32 extending in an angle different from zero to each other such that the first light exit surface 32 is a top surface of the first light guide 3. The first light guide 3 further comprises first further surfaces 33, 34, 35, 36 of which the surface 36 is extending opposite and parallel to the first light exit surface 32. The first light guide 3 may be rectangular or square and may also be bar or rod shaped.

In embodiments, the area of the first light exit surface 32 of the first light guide 3 is 2 times smaller than the area of the first light input surface 31. In this way more solid state light sources can be arranged at the first light input surface and an improved concentration of light providing for an increased brightness can be achieved. In other embodiments the area of the first light exit surface 32 of the light guide is 5, or even 10 times smaller than the area of the first light input surface 31.

The first light sources 21, 22, 23 are arranged adjacent to and in optical contact with the first light input surface 31 of the first light guide 3, while the first light sources 224, 25, 26 are arranged adjacent to and in optical contact with the further surface 35, which in this case functions as a light input surface, extending parallel with and opposite to the first light input surface 31 of the first light guide 3. Alternatively, the first light sources may in another embodiment be arranged adjacent to and in optical contact with only one surface of the light guide, in an embodiment being the first light input surface 31. Alternatively, the first light sources may in yet other embodiments be arranged adjacent to and in optical contact with more than two surfaces of the light guide.

Alternative configurations of the light emitting device according to the invention are also feasible in which the first light exit surface 32 and the further surface 36 are mutually opposite side surfaces and the first light input surface 31 is an end surface.

Furthermore, the first light guide 3 may comprise a transparent material, a luminescent material, a garnet, a light concentrating material or a combination thereof, suitable materials and garnets being described above. In an embodiment, however, the first light guide 3 is a transparent light guide. Alternatively, the first light guide 3 may be a hollow light guide with reflecting inner surfaces. For example, the inner surfaces are made of e.g. a specular reflecting material such as aluminum or silver. The hollow light guide might be shaped such that light is directed to the light exit surface of the hollow light guide. Diffuse reflecting materials can be used as well for this this configuration. For example, the inner surface of the hollow light guide might be coated with a coating comprising Al2O3, TiO2 and/or BaSO4 particles.

Furthermore, the first light guide 3 may be made of a material which has a thermal conductivity being smaller than 1 W/(K*m), such as to improve the spreading of heat.

Also, in an embodiment the first light guide 3 is flat, i.e. the first light guide has a height H being considerably smaller than at least one of the length L and width W, where the height in the embodiment shown on FIGS. 4 and 5 extend perpendicular to both the first light exit surface 32 and the surface 36, and where the length the width both extend perpendicular to the height as well as perpendicular to each other.

In alternative or additional embodiments the first light guide 3 may be a light guide adapted for or capable of converting light with one spectral distribution to light with a different spectral distribution. Thus, in such embodiments the first light guide 3 may be a transparent light guide comprising a material adapted for converting light with one spectral distribution to light with another spectral distribution. The material adapted for converting light with one spectral distribution to light with another spectral distribution may be embedded in the first light guide 3.

The light emitting device 1 furthermore comprises a luminescent element 90. The luminescent element 90 is shown shaped generally as a rod or bar having a second light input surface 91 and a second light exit surface 92 extending in an angle different from zero to each other such that the second light exit surface 92 is an end surface of the luminescent element 90. The luminescent element 90 further comprises second further surfaces 93, 94, 95, 96 of which the surface 96 is extending opposite and parallel to the second light exit surface 92. The luminescent element 90 may also be plate shaped e.g. as a rectangular or square plate.

The luminescent element 90 is arranged with its second light input surface 91 adjacent to the first light exit surface 32 of the first light guide 3. Optionally the luminescent element 90 and the first light guide 3 are at least partially in optical contact with one another. The luminescent element 90 is made of a luminescent material, suitable luminescent materials being described above.

The first light guide 3 comprises a first refractive index n1. The luminescent element 90 comprises a second refractive index n2 which is in an embodiment typically in the order of 1.8. The material of the first light guide 3 and the luminescent element 90, respectively, is in an embodiment chosen such that the second refractive index n2 of the luminescent element 90 is higher than the first refractive index n1 of the first light guide 3. Thereby most of the light coupled into the first light guide 3 will be coupled into the luminescent element 90. A suitable material for the first light guide 3 is thus glass. Also transparent polymers like PMMA, polycarbonate, polystyrene may be used but these materials cannot withstand high temperatures. Of special interest are silicones, which have a low refractive index, typically 1.4 -1.5, and which can withstand high temperatures. Since they are already used on top of LEDs to extract light, they are a natural choice. Since they are flexible, silicones easily can be adapted to the desired application.

The light emitting device 1 furthermore comprises a heat sink element 70. The heat sink element 70 is in embodiments non-transparent and comprises one or more fins 71, 72, 73 for improved heat distribution. It is noted, however, that the fins 71, 72, 73 may in principle be omitted.

The heat sink element 70 is generally arranged on or at a surface of the luminescent element 90 facing away from the first light guide 3 and thereby also facing away from or, in other words, opposite to the second light input surface 91 of the luminescent element 90. In the present embodiment the heat sink element 70 is arranged on the surface 95 extending parallel and opposite to the first light input surface 91 of the luminescent element 90.

In embodiments the heat sink element 70 is made of a metal such as copper, iron or aluminum. The non-transparent heat sink 70 may also be made of a reflective ceramic such as alumina or boron nitride. In more general terms, suitable materials for such a non-transparent heat sink element 70 are materials which have a high heat conductivity, i.e. a heat conductivity which is larger than e.g. 1 W/(m*K), and preferably larger than 10 W/(m*K) or even larger than 20 W/(K*m).

In the embodiments shown herein the fins 71, 72, 73 of the heat sink element 70 extend in a longitudinal direction of the heat sink element, or in other words, in the mounted position of the heat sink element in a direction substantially perpendicular to both the second light exit surface 92 and the further surface 96 of the luminescent element 90. Alternative embodiments are also feasible in which the fins of the heat sink element extend in any other direction, such as e.g. in the transversal direction of the heat sink element or in other words parallel to the second light exit surface 92 of the luminescent element 90.

In the embodiments shown herein the heat sink element 70 extends over the whole area of the further surface 95 of the luminescent element 90. Alternative embodiments in which the heat sink element 70 extends over only a part of the area of the further surface 95 of the luminescent element 90 are, however, also feasible.

With reference to FIGS. 4 and 5 a light emitting device according to the invention generally works as follows. First light 13 having a first spectral distribution is emitted by each light source of the first light sources 21, 22, 23, 24, 25, 26. The first light 13 having the first spectral distribution is then coupled into the first light guide 3 at the first light input surface 31. The first light having the first spectral distribution is coupled out of the first light guide 3 at the first light exit surface 32. The first light 13 having the first spectral distribution is then coupled into the luminescent element 90, and at least a part of the first light 13 with the first spectral distribution is converted by the luminescent element 90 to second light 14 having a second spectral distribution. The second light 14 is guided by and through the luminescent element 90 and coupled out of the second light exit surface 96 of the luminescent element 90 and is thus emitted by the light emitting device 1. Thus there is one surface of the luminescent element 90 from which the light exits or is emitted, which is the second light exit surface 96.

Simultaneously heat generated by the light sources 21, 22, 23, 24, 25, 26 is distributed away from the first light guide 3 by means of the heat sink element 70. In more detail the heat is distributed away from the first light guide 3 via the luminescent element 90. Thus, the first light guide 3 spreads and distributes away the heat generated by the light sources 21, 22, 23, 24, 25, 26 and the remaining heat present in the luminescent element 90 is distributed away by the heat sink element 70.

Figure 6:
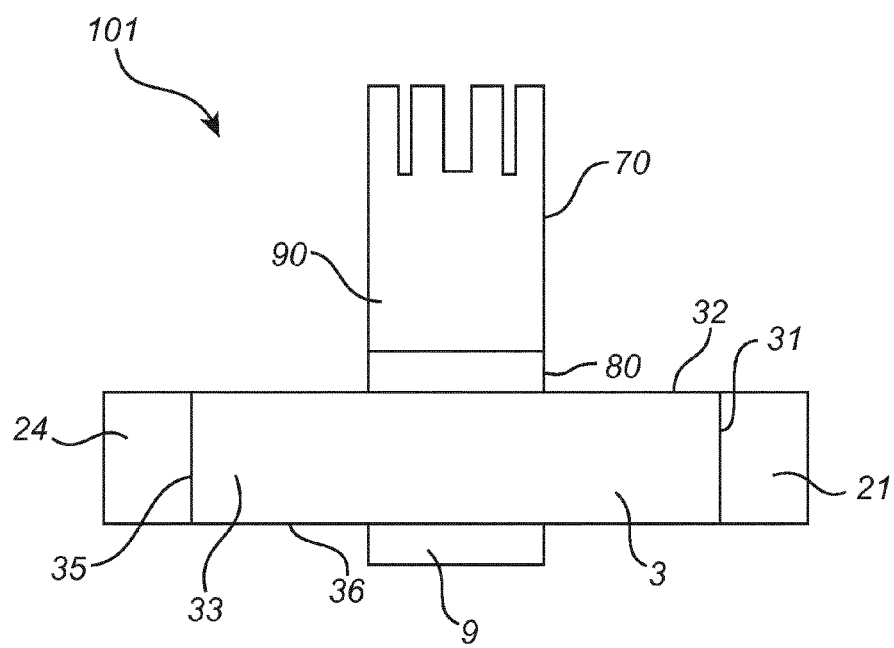
FIG. 6 shows an end view of a second embodiment of a light emitting device according to the invention.

Turning now to FIG. 6, an end view of a second embodiment of a light emitting device 101 according to the invention is shown. The light emitting device 101 differs from that shown in FIG. 4 and described above in that it further comprises a coupling element 80 adapted for coupling light into the at least one luminescent element and a coupling element 9 adapted for coupling light out of the first light guide 3.

The coupling element 80 is arranged between the first light guide 3 and the luminescent element 90. The coupling element 80 may e.g. be an optical adhesive or it may be a refractive or diffractive grating or scattering layer or structures. Alternatively, the coupling element 80 may simply be air, e.g. in the form of an air gap. Other suitable coupling elements are described above. In an embodiment the coupling element 80 comprises a material chosen such that a third refractive index n3 of the coupling element is smaller than the second refractive index n2 of the luminescent element 90 and larger than the first refractive index n1 of the first light guide 3. Alternatively the third refractive index n3 of the coupling element is smaller than both the second refractive index n2 of the luminescent element 90 and the first refractive index n1 of the first light guide 3. Furthermore, the coupling element 80 may optionally be in optical contact with both the first light guide 3 and the luminescent element 90.

The coupling element 9 is arranged on a surface 33 of the first light guide 3 facing away from the luminescent element 90, in an embodiment in a position opposite to that of the luminescent element 90. The coupling element 9 may e.g. be a scattering or a reflecting element or pattern. For example, a coating or layer of scattering materials, such as TiO2, Al2O3 or BaSO4 particles, may be used. Other suitable coupling elements are described above.

It is noted that alternative embodiments in which either one of the coupling element 80 and the coupling element 9 is omitted are also feasible.

Figure 7:
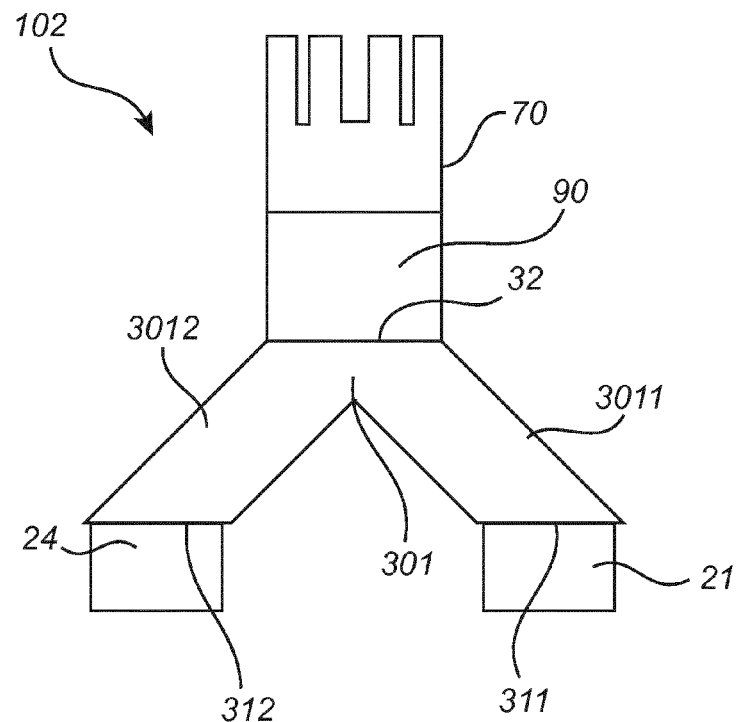
FIG. 7 shows an end view of a third embodiment of a light emitting device according to the invention.

FIG. 7 shows an end view of a third embodiment of a light emitting device 102 according to the invention. The light emitting device 102 differs from that shown in FIG. 4 and described above in that the first light guide 301 is a shaped light guide comprising two legs or parts 3011 and 3012 each comprising a light input surface 311 and 312, respectively, each associated with a first light source 21 and 24, respectively. The two parts 3011 and 3012 of the first light guide 301 further comprise one common first light exit surface 32, at which the luminescent element 90 is provided.

It is noted that in principle the first light guide 3 may be provided with any feasible shape, the shape shown in FIG. 7 thus being a non-limiting example only.

Such a configuration provides for light emitting devices which may be shaped according to e.g. aesthetic, physical or practical requirements.

Figure 8:
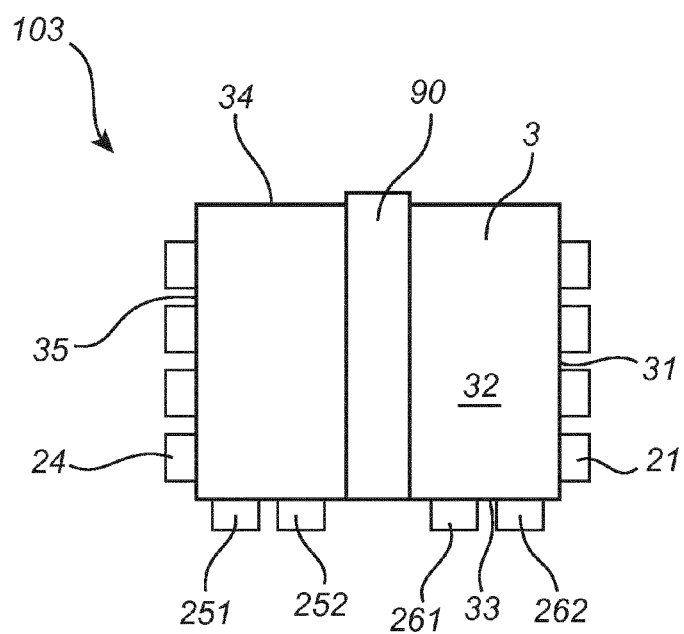
FIG. 8 shows an end view of a fourth embodiment of a light emitting device according to the invention.

FIG. 8 shows a top view of a fourth embodiment of a light emitting device 103 according to the invention. For the sake of simplicity the heat sink element has been omitted. The light emitting device 103 differs from that shown in FIG. 4 and described above only in that additional light sources 251, 252, 261, 262 are arranged at the first further surface 33 of the first light guide 3 such that light may be coupled into the light guide from three sides. Thereby the intensity of the light emitted by the light emitting device 103 may be increased compared to the light emitting devices described above.

Obviously, it would in embodiments of the type shown in FIG. 8 also be feasible to provide light sources on the surface 34 and/or to omit the light sources provided on the surface 35.

Figure 9:
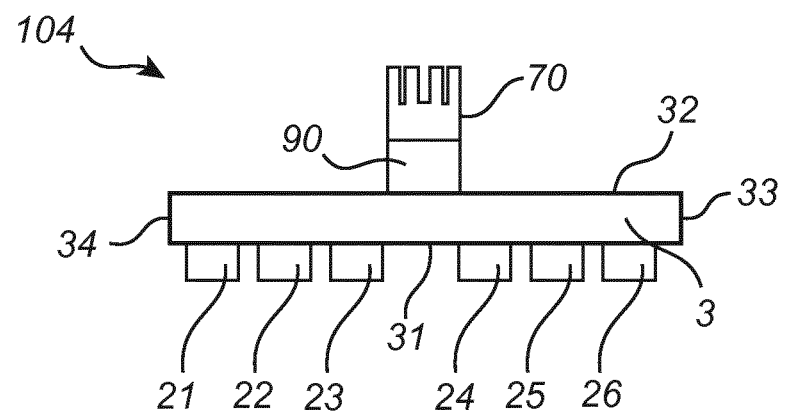
FIG. 9 shows an end view of a fifth embodiment of a light emitting device according to the invention, the heat sink element being removed for simplicity.

FIG. 9 shows an end view of a fifth embodiment of a light emitting device 104 according to the invention. The light emitting device 104 differs from that shown in FIG. 4 and described above in that the first light exit surface 32 and the first light input surface 31 of the first light guide 3 are mutually parallel and opposite surfaces.

In this embodiment the light sources 21, 22, 23, 24, 25, 26 are arranged in optical contact with the first light input surface 31 of the light guide 3. Furthermore, in a further embodiment the light sources are LEDs emitting at large emission angles for improved efficiency.

Furthermore, particularly in the embodiment according to FIG. 9, but in principle irrespective of the embodiment, it is also possible to place reflective elements such as mirrors on the first further surfaces 33, 34, 35 and 36, on the light exit surface 32 adjacent to the luminescent element 90 and/or on the light input surface 31 in between the light sources, to recycle some of the light that will otherwise possibly escape through these surfaces. Thereby the intensity of the light emitted by the light emitting device 104 may be increased. Reflective elements may also be placed on surfaces of the luminescent element 90 other than the second light input surface and second output surface of the luminescent element 90 to enhance the guiding of light in the luminescent light guide to the second light exit surface. The heat sink element may also function as a reflector for this purpose.

Figure 10:
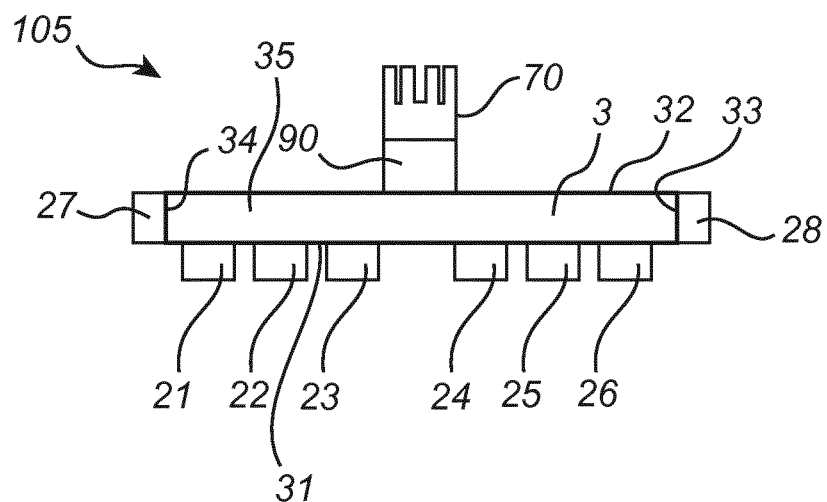
FIG. 10 shows an end view of a sixth embodiment of a light emitting device according to the invention.

FIG. 10 shows an end view of a sixth embodiment of a light emitting device 105 according to the invention, in which light sources 21, 22, 23, 24, 25, 26, 27 and 28 are arranged on the first light guide 3 both on the surface extending opposite and parallel to the first light exit surface 32, here being the first light input surface 31, and on two of the surfaces extending in an angle different from zero to the first light exit surface 32, here being the surfaces 33 and 34.

Hence, the light emitting device 105 shown in FIG. 10 is in principle a combination of the embodiments shown in FIGS. 8 and 9. Thus, it would also be feasible to provide light sources on the remaining first further surfaces 35 and 36, the latter not being visible on FIG. 10.

Figure 11:
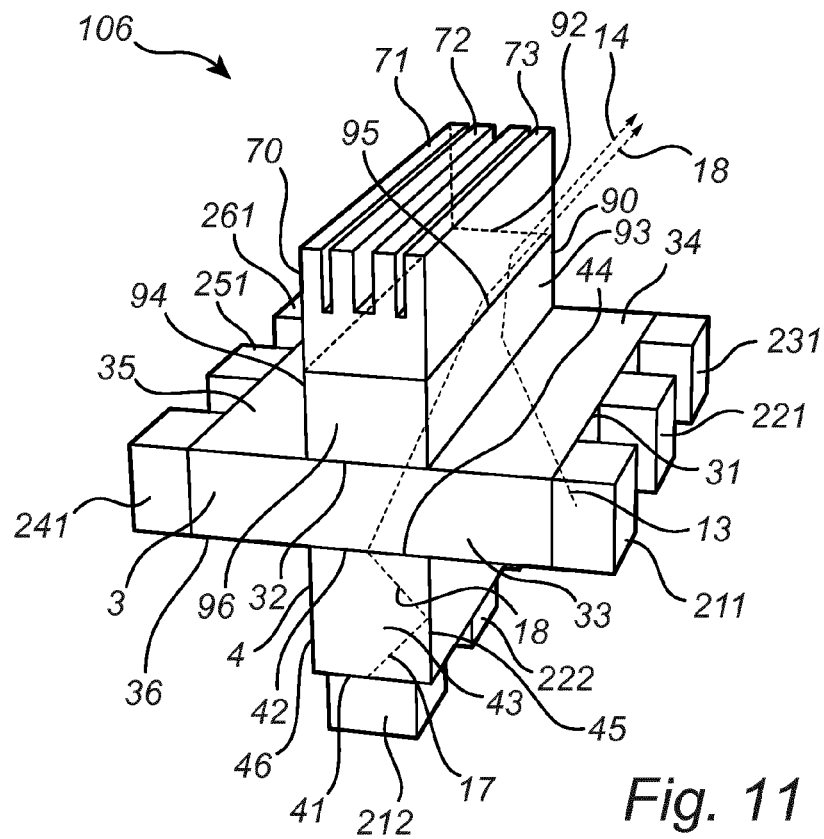
FIG. 11 shows a perspective view of a seventh embodiment of a light emitting device according to the invention.
Figure 12:
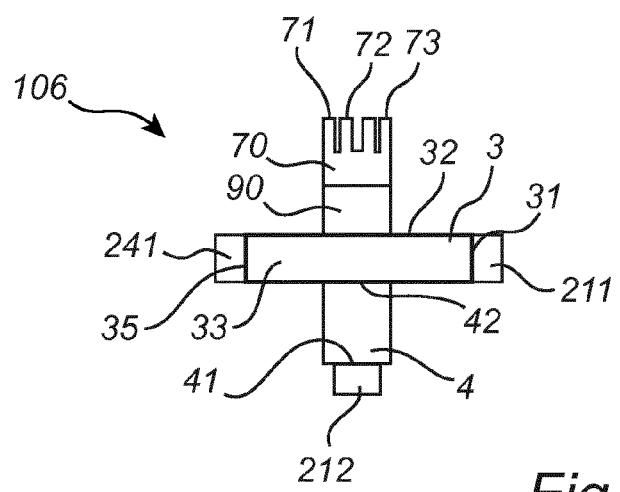
FIG. 12 shows an end view of the light emitting device according to FIG. 11.

FIG. 11 shows a perspective view of a light emitting device 106 according to a seventh embodiment of the invention. FIG. 12 shows an end view of the light emitting device 106.

The light emitting device 106 comprises first light sources 211, 221, 231, 241, 251, 261, a first light guide 3, a luminescent element 90 and a heat sink element 70 with fins 71, 72, 73 according to any of the embodiments described above.

The light emitting device 106 further comprises second light sources 212, 222, and a second light guide 4.

The second light guide 4 is arranged adjacent to a surface of the first light guide 3 facing away from the luminescent element 90, on FIGS. 11 and 12 being the surface 36 extending parallel and opposite to the first light exit surface 32.

In an alternative embodiment the second light guide 4 may be arranged adjacent to a surface of the at least one luminescent element 90 such that light is coupled into the luminescent element 90 from more than one side.

The second light guide 4 is shown shaped generally as a bar or rod having a third light input surface 41 and a third light exit surface 42 extending parallel and opposite to one another such that the third light input surface 41 and the third light exit surface 42 are opposite side surfaces of the second light guide 4. The second light guide 4 further comprises third further surfaces 43, 44, 45, 46. The second light guide 4 may also be plate shaped e.g. as a rectangular or square plate.

The second light sources 212, 222 are arranged adjacent to and in optical contact with the third light input surface 41 of the second light guide 4. In other embodiments additional light sources may be provided adjacent to one or more of the at least one third further surfaces of the second light guide 4.

Alternative configurations of the light emitting device 106 according to FIGS. 11 and 12 are also feasible in which the third light input surface 41 and the third light exit surface 42 extend at an angle different from zero with respect to each other, e.g. such that the third light exit surface 42 is an end surface of the second light guide 4 or such that the third light exit surface 42 and the surface 46 are mutually opposite side surfaces and the second light input surface 41 is an end surface.

Furthermore, the second light guide 4 may comprise a transparent material, a luminescent material, a garnet, a light concentrating material or a combination thereof, being different from or the same as the material of the first light guide 3. Suitable materials and garnets are described above. Alternatively, the second light guide 4 may be a hollow light guide with reflecting inner surfaces.

In an embodiment the second light guide 4 is a transparent light guide comprising a material adapted for converting light with one spectral distribution to light with another spectral distribution. The material adapted for converting light with one spectral distribution to light with another spectral distribution may be arranged at a surface of the second light guide 4, but it is in an embodiment embedded in the second light guide 4, and the material may be different from or the same as the material of the first light guide 3.

Furthermore, the second light guide 4 is made of a material which in an embodiment has a thermal conductivity being smaller than 1 W/(K*m).

Also, the second light guide 4 may be flat, i.e. the second light guide may have a height H being considerably smaller than at least one of the length L and width W, where the height in the embodiment shown on FIGS. 11 and 12 extend perpendicular to both the third light input surface 41 and the second light exit surface 42, and where the length and the width both extend perpendicular to the height direction as well as perpendicular to each other.

Also, the first light input surface 31 and the first light exit surface 32 of the first light guide 3 of the light emitting device 106 extend in an angle different from zero with respect to each other. Other alternative configurations of the light emitting device 106 according to FIGS. 11 and 12, in which the first light exit surface 32 and the first light input surface 31 are mutually opposite and parallel surfaces, are also feasible.

A light emitting device 106 according to FIGS. 11 and 12 generally works as follows. First light 13 having a first spectral distribution is emitted by each light source of the first light sources 211, 221, 231, 241, 251, 261. The first light 13 having the first spectral distribution is then coupled into the first light guide 3 at the first light input surface 31. The first light 13 having the first spectral distribution is coupled out of the first light guide 3 at the first light exit surface 32. The first light 13 having the first spectral distribution is then coupled into the luminescent element 90. At least a part of the first light 13 with the first spectral distribution is converted by the luminescent element 90 to second light 14 having a second spectral distribution. The second light 14 is guided through the luminescent element 90 and coupled out of the second light exit surface 96 and is thus emitted by the light emitting device 106. The heat generated by the first light sources 211, 221, 231, 241, 251, 261 is distributed away from the first light guide 3 by means of the heat sink element 70.

Simultaneously, third light 17 having a third spectral distribution is emitted by each light source of the second light sources 212, 222. The third light 17 having the third spectral distribution is then coupled into the second light guide 4 at the third light input surface 41. At least a part of the third light 17 with the third spectral distribution is converted by the second light guide 4 to fourth light 18 having a fourth spectral distribution. The fourth light 18 having the fourth spectral distribution is coupled out of the second light guide 4 at the third light exit surface 42. The fourth light 18 having the fourth spectral distribution is then coupled through the first light guide 3, in which it may or may not be converted to light with yet another spectral distribution, and into the luminescent element 90, guided through the luminescent element 90 and coupled out of the second light exit surface 96 and is thus emitted by the light emitting device 106. Simultaneously the heat generated by the second light sources 212, 222 is distributed away from the second light guide 4 and the first light guide 3 by means of the heat sink element 70.

In alternative or additional embodiments the second light guide 4 may be a transparent light guide not being adapted for converting incident light to light with a different spectral distribution, and/or the luminescent element 90 may be adapted for also converting the light incident from the second light guide 4 to light with a different spectral distribution.

In a further alternative or additional embodiment it would be feasible to provide the second light guide with a separate luminescent element and a separate heat sink element. Such an embodiment may for instance be obtained by providing two light emitting devices 1 of any of the types described above in relation to FIGS. 4 to 10 and arrange them such that the respective heat sink elements face away from each other.

Figure 13:
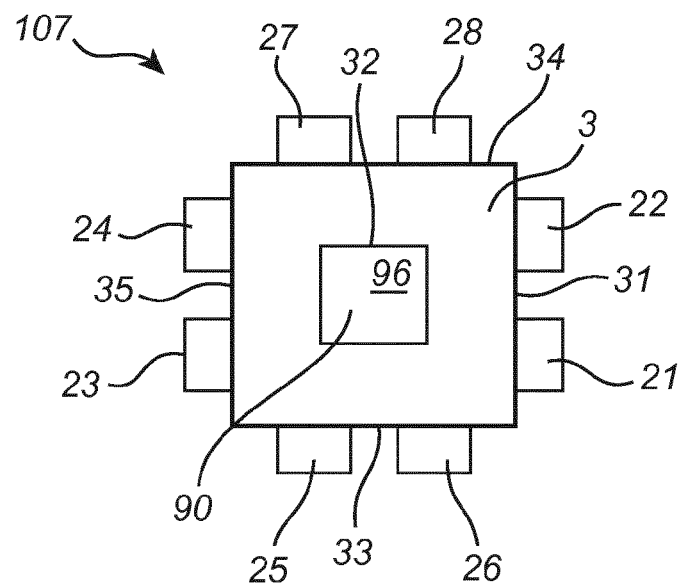
FIG. 13 shows an end view of an eighth embodiment of a light emitting device according to the invention.

Turning now to FIG. 13, an end view of an eighth embodiment of a light emitting device 107 according to the invention is shown. The light emitting device 107 differs from that shown in FIG. 4 and described above in that the luminescent element 90 is arranged such that it is surrounded by the first light guide 3 on four sides thereof. In other words the luminescent element 90 is arranged extending through the first light guide 3.

In alternative embodiments the luminescent element 90 may be arranged such that it is surrounded by the first light guide 3 on two, three or even five sides thereof.

Figure 14:
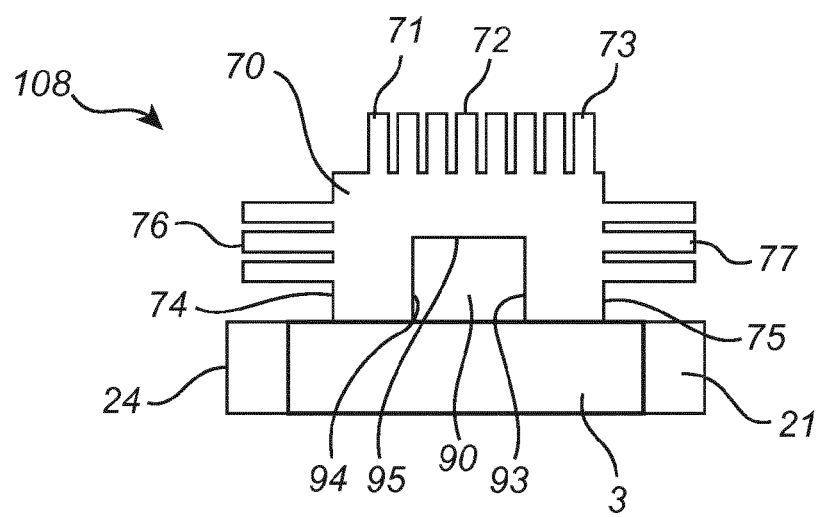
FIG. 14 shows an end view of a ninth embodiment of a light emitting device according to the invention.

Turning now to FIG. 14, an end view of a ninth embodiment of a light emitting device 108 according to the invention is shown. The light emitting device 108 differs from that shown in FIG. 4 and described above in that further heat sink elements 74 and 75 are provided such that the luminescent element 90 is provided with heat sink elements 70, 74, 75 on three sides 93, 94 and 95 thereof for a more efficient distribution of heat away from the first light guide 3.

The further heat sink elements 74 and 75 may be provided as separate heat sink elements or be in one piece with the heat sink element 70. The further heat sink elements 74 and 75 may be provided with fins 76 and 77, respectively.

In an embodiment the further heat sink elements 74 and 75 are made of a metal such as copper, iron or aluminum. The further heat sink elements 74 and 75 may also be made of a reflective ceramic such as alumina or boron nitride. In more general terms, suitable materials for such further heat sink elements 74 and 75 are materials which have a high heat conductivity, i.e. a heat conductivity which is larger than e.g. 1 W/(m*K), and preferably larger than 10 W/(m*K) or even larger than 20 W/(K*m).

In the embodiments shown herein the fins 76 and 77 of the respective further heat sink elements 74 and 75 extend in a longitudinal direction of the heat sink element, or in other words, in the mounted position of the heat sink element in a direction substantially perpendicular to both the second light exit surface 92 and the further surface 96 of the luminescent element 90. Alternative embodiments in which the fins of the further heat sink elements extend in any other direction, such as e.g. in the transversal direction of the heat sink element or in other words parallel to the second light exit surface 92 of the luminescent element 90, are also feasible.

In the embodiments shown herein the further heat sink elements 74 and 75 extend over the whole area of the further surfaces 93 and 94, respectively, of the luminescent element 90. Alternative embodiments in which the further heat sink elements 74 and 75 extend over only a part of the area of the further surfaces 93 and 94, respectively, of the luminescent element 90 are, however, also feasible.

Any of the heat sink elements 70, 74, 75 described herein may furthermore optionally comprise at least one surface adapted for reflecting light, in an embodiment being the surface of the heat sink element facing the luminescent element 90.

The person skilled in the art realizes that the present invention by no means is limited to the embodiments described above. On the contrary, many modifications and variations are possible within the scope of the appended claims.

Particularly, the various elements and features of the various embodiments described herein may be combined freely.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
   a plurality of first solid state light sources adapted for, in operation, emitting first light with a first spectral distribution,
   a first light guide comprising a first light input surface, a first light exit surface extending in an angle different from zero to one another and at least one first further surface, the first light guide being adapted for receiving the first light with the first spectral distribution at the first light input surface, guiding the first light to the first light exit surface and coupling the first light with the first spectral distribution out of the first light exit surface, the plurality of light sources being arranged adjacent to and in optical contact with the first light input surface of the first light guide,
   at least one luminescent element arranged on the first light exit surface of the first light guide, the at least one luminescent element comprising a second light input surface, a second light exit surface and at least one second further surface, the second light input surface and the second light exit surface extending at an angle different from zero with respect to another, the luminescent element being adapted for receiving the first light with the first spectral distribution at the second light input surface, converting at least a part of the first light with the first spectral distribution to second light with a second spectral distribution, guiding the second light to the second light exit surface and coupling the second light with the second spectral distribution out of the second light exit surface,
   the light emitting device further comprising at least one first heat sink element arranged at or on a surface of the luminescent element opposite and parallel to the second light input surface.

2. A light emitting device according to claim 1, wherein the first light guide comprises a first refractive index, the at least one luminescent element comprises a second refractive index and the second refractive index of the at least one luminescent element is larger than the first refractive index of the first light guide.

3. A light emitting device according to claim 2, and further comprising a coupling element adapted for coupling light out of the first light guide and into the at least one luminescent element and arranged between the first light guide and the at least one luminescent element.

4. A light emitting device according to claim 3, wherein the first light guide comprises a first refractive index, the at least one luminescent element comprises a second refractive index, the coupling element comprises a third refractive index and the third refractive index of the coupling element is smaller than at least one of the second refractive index of the at least one luminescent element and the first refractive index of the first light guide.

5. A light emitting device according to claim 1, wherein the plurality of light sources are also arranged adjacent to and in optical contact with at least one first further surface of the first light guide.

6. A light emitting device according to claim 1, wherein the area of the first light exit surface and the first light guide is at least 2 times smaller than the area of the first light input surface.

7. A light emitting device according to claim 1, wherein the first light guide furthermore is adapted for converting incident light to converted light with a spectral distribution being different from that of the incident light.

8. A light emitting device according to claim 1, wherein the light emitting device further comprises at least one further light source arranged at the at least one first further surface of the first light guide.

9. A light emitting device according to claim 1, wherein the at least one heat sink element is made of a material having a thermal conductivity being larger than 1 W/(K*m), larger than 10 W/(K*m) or larger than 20 W/(K*m).

10. A light emitting device according to claim 1, and further comprising at least one further heat sink element arranged at one of the at least one first further surface of the at least one luminescent element.

11. A light emitting device according to claim 1, and further comprising at least one coupling element adapted for coupling light out of the first light guide, the coupling element being arranged on a surface of the first light guide facing away from the at least one luminescent element.

12. A light emitting device according to claim 1, and further comprising:
   at least one second light source adapted for, in operation, emitting third light with a third spectral distribution, and
   a second light guide comprising a third light input surface and a third light exit surface,
   the second light guide being adapted for receiving the third light with the third spectral distribution at the third light input surface, guiding the third light to the third light exit surface and coupling the third light with the third spectral distribution out of the third light exit surface, the luminescent element further being adapted for receiving the third light with the third spectral distribution coupled out of the third light exit surface of the second light guide, guiding the third light to the second light exit surface and coupling the third light with the third spectral distribution out of the second light exit surface.

13. A light emitting device according to claim 12, wherein the second light guide furthermore is adapted for converting at least a part of the third light with the third spectral distribution to fourth light with a fourth spectral distribution, guiding the fourth light to the third light exit surface and coupling the fourth light with the fourth spectral distribution out of the third light exit surface.

* * * * *